(12) United States Patent
Teh et al.

(10) Patent No.: US 9,601,421 B2
(45) Date of Patent: Mar. 21, 2017

(54) BBUL MATERIAL INTEGRATION IN-PLANE WITH EMBEDDED DIE FOR WARPAGE CONTROL

(75) Inventors: Weng Hong Teh, Phoenix, AZ (US); Deepak V. Kulkarni, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/976,356

(22) PCT Filed: Dec. 30, 2011

(86) PCT No.: PCT/US2011/068045
§ 371 (c)(1),
(2), (4) Date: Jun. 26, 2013

(87) PCT Pub. No.: WO2013/101161
PCT Pub. Date: Jul. 4, 2013

(65) Prior Publication Data
US 2014/0217599 A1    Aug. 7, 2014

(51) Int. Cl.
*H01L 23/498* (2006.01)
*H01L 23/00* (2006.01)
(Continued)

(52) U.S. Cl.
CPC ........ *H01L 23/49822* (2013.01); *H01L 24/19* (2013.01); *H01L 24/20* (2013.01); *H01L 24/82* (2013.01); *H01L 24/96* (2013.01); *H01L 24/13* (2013.01); *H01L 24/16* (2013.01); *H01L 24/73* (2013.01); *H01L 24/92* (2013.01); *H01L 2224/0401* (2013.01); *H01L 2224/04105* (2013.01); *H01L 2224/16145* (2013.01); *H01L 2224/32225* (2013.01); *H01L 2224/73259* (2013.01); *H01L 2224/73267* (2013.01);
(Continued)

(58) Field of Classification Search
USPC .......................................................... 257/773
See application file for complete search history.

(56) References Cited

U.S. PATENT DOCUMENTS 6,271,469 B1 * 8/2001 Ma et al. ...................... 174/521
7,723,164 B2    5/2010 Lu et al.
(Continued)

OTHER PUBLICATIONS

Intel Corporation, et al., International Search Report and Written Opinion mailed Sep. 27, 2012 for PCT/US2011/068045.
(Continued)

*Primary Examiner* — Daniel Whalen
(74) *Attorney, Agent, or Firm* — Blakely, Sokoloff, Taylor & Zafman LLP (57) ABSTRACT

An apparatus including a die including a first side and an opposite second side including a device side with contact points and lateral sidewalls defining a thickness of the die; a primary core adjacent at least a pair of the lateral sidewalls of the die; and a build-up carrier coupled to the second side of the die, the build-up carrier including a plurality of alternating layers of conductive material and insulating material, wherein at least one of the layers of conductive material is coupled to one of the contact points of the die. A method of forming a package and an apparatus including a computing device including a package are also disclosed.

11 Claims, 9 Drawing Sheets

(51) Int. Cl.
  *H05K 3/46* (2006.01)
  *H05K 3/00* (2006.01)

(52) U.S. Cl.
  CPC ............ *H01L 2224/92244* (2013.01); *H01L 2225/1035* (2013.01); *H01L 2924/10253* (2013.01); *H01L 2924/12042* (2013.01); *H01L 2924/1431* (2013.01); *H01L 2924/1434* (2013.01); *H01L 2924/15153* (2013.01); *H01L 2924/3511* (2013.01); *H05K 3/0097* (2013.01); *H05K 3/4682* (2013.01); *H05K 2201/10674* (2013.01)

(56) References Cited

U.S. PATENT DOCUMENTS

| | | | | |
|---|---|---|---|---|
| 2007/0096292 | A1* | 5/2007 | Machida | H01L 21/4857 257/700 |
| 2008/0054448 | A1* | 3/2008 | Lu et al. | 257/707 |
| 2009/0294942 | A1* | 12/2009 | Palmer et al. | 257/686 |
| 2011/0228464 | A1* | 9/2011 | Guzek et al. | 361/679.31 |
| 2011/0241215 | A1 | 10/2011 | Sankman et al. | |

OTHER PUBLICATIONS

Intel Corporation, International Preliminary Report on Patentability dated Jul. 10, 2014 for PCT/US2011/068045.

\* cited by examiner

BBUL MATERIAL INTEGRATION IN-PLANE WITH EMBEDDED DIE FOR WARPAGE CONTROL

CROSS-REFERENCE TO RELATED APPLICATION

This patent application is a U.S. National Phase Application under 35 U.S.C. §371 of International Application No. PCT/US2011/068045, filed Dec. 30, 2011, entitled BBUL MATERIAL INTEGRATION IN-PLANE WITH EMBEDDED DIE FOR WARPAGE CONTROL.

BACKGROUND

Field

Packaging for microelectronic devices.

Description of Related Art

Microelectronic packaging technology, including methods to mechanically and electrically attach a silicon die (e.g., a microprocessor) to a substrate or other carrier continues to be refined and improved. Bumpless Build-Up Layer (BBUL) technology is one approach to a packaging architecture. Among its advantages, BBUL eliminates the need for assembly, eliminates prior solder ball interconnections (e.g., flip-chip interconnections), reduces stress on low-k interlayer dielectric of dies due to die-to-substrate coefficient of thermal expansion (CTE mismatch), and reduces package inductance through elimination of core and flip-chip interconnect for improved input/output (I/O) and power delivery performance.

One issue that arises with a package, such as a BBUL, is warpage. A BBUL package typically consists of a dielectric material, possibly of a number of films, separating conductive lines or traces of a material such as copper. The package is also typically considerably larger than the die. Accordingly, when combined with a rigid die, the combination including a significantly larger package can experience warpage. Any such warpage may be acceptable in those instances where the combination of die and package constitute a complete structure. However, one trend is to connect at least one additional package to the BBUL/die package such as package on package (POP) configurations or stacked on a die (e.g., a through silicon via (TSV) die, e.g., wide I/O packaging. In such case, alignment and stability of connections becomes more significant.

DETAILED DESCRIPTION

Figure 1:
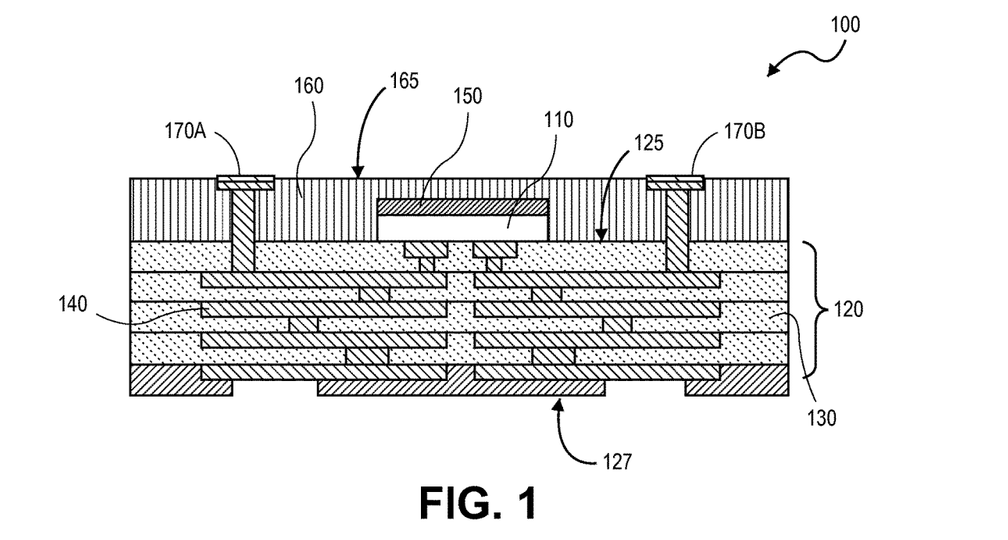
FIG. 1 shows a cross-sectional view one embodiment of a microelectronic package including a non-through silicon via die surrounded by a primary core material and a build-up carrier connected to the die and the primary core.

FIG. 1 shows a cross-sectional view of a microelectronic package according to one embodiment. As illustrated in FIG. 1, microelectronic package 100 utilizes bumpless build-up layer (BBUL) technology. Microelectronic package 100 includes carrier 120 having surface 125 and opposing surface 127. Die 110 such as a microprocessor die is attached to surface 125 of carrier 120. In one embodiment, die 110 is a silicon die or the like having a thickness of approximately 150 micrometers (μm). In another example, die 110 can be a silicon die or the like that has a thickness less than 150 µm such as 50 µm to 150 µm. It is appreciated that other thicknesses for die 110 are possible.

Referring to FIG. 1, die 110 and carrier 120 are in direct physical contact with each other (e.g., there are no solder bumps connecting die 110 to carrier 120). Die 110 is directly connected to carrier 120 at its device side (device side down as viewed). Carrier 120 includes multiple build-up layers including dielectric layers 130 and conductive layers 140 (connected with conductive vias or the like) that provide connectivity to the die (power, ground, input/output, etc.).

Overlying die 110 of microelectronic package 100 in FIG. 1 is adhesive layer 150 of, for example, a die backside film (DBF) polymer, epoxy based adhesive with or without fillers. Attached to adhesive layer 150 and to surface 125 of carrier 120 and surrounding the lateral side walls of die 110 is primary core 160. In one embodiment, primary core 160 is a material that has a coefficient of thermal expansion that is at least that of silicon or the die material. In another embodiment, primary core 160 is a material that is different from a material of the insulating layers of carrier 120. Representatively, the material for primary core may be selected from a conventional mold or a resin; an epoxy with differently engineered filler materials than a conventional mold or an epoxy material used in similar packaging configurations; an epoxy with different component weight percent or resin properties than conventional mold or epoxy material. Another suitable material for primary core 160 is a metal material such as copper. Primary core 160 is intended to inhibit warpage of microelectronic package 100 by providing a relatively stiffer material compared to a material of a dielectric material of carrier 120. In one embodiment, a material for primary core 160 is selected that achieves a predetermined warpage target for a given temperature, package architecture, number of package layers, body size and die to package ratio. Representatively, a property of the material may be selected to have a similar coefficient of thermal expansion ("CTE") to that of a material of a die and/or a greater Young's modulus than a dielectric chosen for the bulk of the package. A predetermined warpage target may be, for example, less than 10 percent warpage or less than 5 percent lateral warpage for an operating temperature of the package.

FIG. 1 also shows contact 170A and contact 170B on exposed surface 165 of primary core 160. Contact 170A and contact 170B are connected to conductive layers of carrier 120. Contact 170A and contact 170B allow a second device, such as a memory device or microprocessor (possibly encompassed in a package) to be electrically connected to microelectronic package 100.

In this embodiment, primary core 160 surrounds contact 170A and contact 170B. A thickness, material property and area may all be considered in determining the dimensions of primary core 160 as a component of microelectronic package 100 that inhibits warpage of the package. Still further, a thickness of die 110 can effect the dimensions of primary core 160. In one embodiment, an area covered by primary core 160 may include an entire surface of microelectronic package 100. In another embodiment, an area covered by primary core 160 may be sufficient to surround the four lateral side walls of die 110 but not extend to the entire remaining surface of microelectronic electronic package. For example, in this embodiment, primary core 160 will not extend to an area including contact points from carrier 120 to two contacts points 170A and 170B. In such case, a material of the build-up carrier (e.g., a dielectric material) will define a secondary core, surrounding die 110 and primary core 160. Likewise, a thickness of primary core 160 may vary. In one embodiment, such as shown in FIG. 1, primary core 160 has a thickness, t, that is greater than a thickness of die 110 such that die 110 is positioned within a cavity of primary core 160 and all lateral side portions of die 110 are within the cavity. In one embodiment, warpage control for a microelectronic package including a primary core material as described is maximized when a thickness of the primary core is at least similar to a thickness of the die and encapsulates the die by covering the die back side. In this embodiment, die 110 is a non-through silicon via (non-TSV) die so access to the back side of die 110 is not necessary. The overall z-height of the package is increased by the thickness of the primary core material that covers the die, where z-height is a consideration, a material for primary core 160 should be selected so that a thickness of the material can be minimized (i.e., maintaining a low z-height of the package) and provide a desired warpage control. In another embodiment, a thickness, t, of primary core 160 is selected so that less than an entire portion of each lateral side wall of die 110 is within a cavity in the primary core (e.g., where dielectric material other than a primary core material partially surrounds the lateral side walls of die 110).

Figure 2:
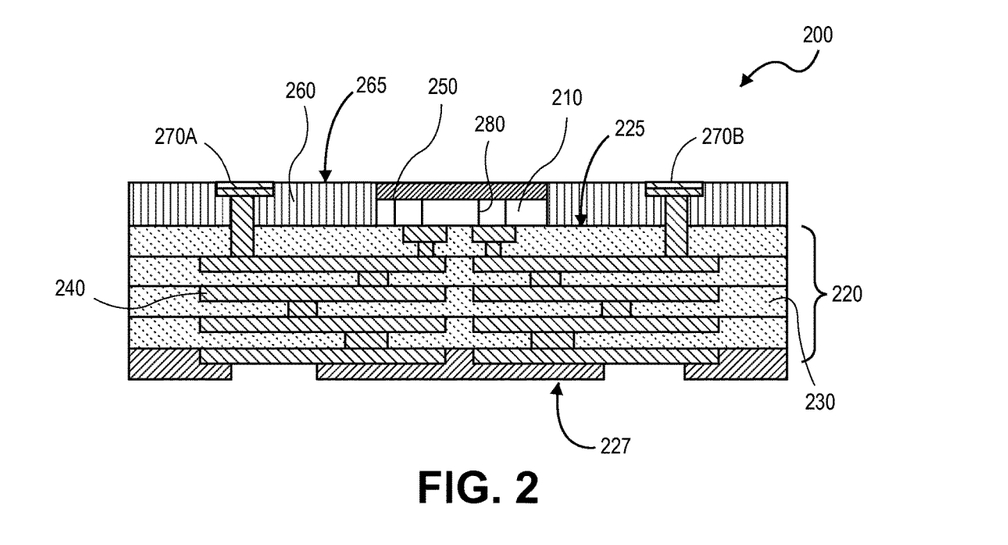
FIG. 2 shows a cross-sectional view another embodiment of a microelectronic package including a through silicon via die surrounded by a primary core material and a build-up carrier connected to the die and the primary core.

FIG. 2 shows another embodiment of a microelectronic package that includes a die having through substrate vias (TSVs). FIG. 2 shows microelectronic package 200 including carrier 220 having surface 225 and opposing surface 227 with a number of conductive layers or levels disposed therein and separated by insulating material 230. Connected to first surface 225 of carrier 220 is die 210 (device side down as viewed). Overlying die 210 is adhesive 250. Also connected to surface 225 of carrier 220 and surrounding die 210 is primary core 260 which, as described above in the embodiment of FIG. 1, is selected in one embodiment of a material that has a coefficient of thermal expansion ("CTE") that is at least that of silicon or other die material. In another embodiment, a material of primary core is a material that has a similar Young's modulus, CTE, and/or glass transition temperature ("Tg") to that of a dielectric material chosen for the bulk of the remainder of the package, and/or a coverage engineered such that an overall package (e.g., a BBUL package) with integrated primary core material achieves a predetermined warpage target for a given, but not limited to, temperature, package architecture, number of package layers (layer counts), body size and die to package area ratio.

As shown in FIG. 2, in this embodiment, surface 265 of primary core 260 is in a plane with a surface of adhesive 250 on die 210. In the embodiment shown in FIG. 2, die 210 includes through substrate vias (TSVs) 280 extending from a device side (adjacent surface 225 of carrier 220) through a die culminating in contacts on opposite surface of the die. In this manner, a second die or other device may be connected to die 210.

FIG. 2 also shows contact 270A and contact 270B exposed on surface 265 of primary core 260. Contact 270A and contact 270B are electrically connected to respective conductive material lines or traces in carrier 220. As viewed, primary core 260 envelopes or surrounds contact 270A and contact 270B. It is appreciated that the area covered by primary core 260 may be selected to be that area sufficient to inhibit package warpage. In addition, FIG. 2 shows that primary core material does not encapsulate die 210 by covering a back side of the die. Accordingly, the effect of primary core 260 on the z-height of the package is minimal. In one embodiment, die 210 is a TSV die. Die 210 includes conductive vias 280 that extend from a device side of die 210 (adjacent surface 225 of carrier 220) to, for example, contacts on an opposing surface. Such conductive vias and possible contacts allow another die or other device to be connected to die 210.

The embodiments of a microelectronic package described above with respect to FIG. 1 and FIG. 2 integrate a primary core or primary core material in-plane with embedded die BBUL architecture. The integration enables increased warpage control, especially for large surface area (e.g., on the order of 17×17 mm$^2$) and ultrathin (e.g., less than 150 μm) dies (both TSV and non-TSV dies) where warpage might be more likely. The integration also provides a warpage control process/architectural solution within BBUL coreless flow while maintaining a low z-height advantage due to the embedded nature of the secondary warpage-control material. Integrating a warpage control material into a BBUL package and maintaining a similar z-height budget allows an engineered and scalable integration solution to warpage control since the primary core shares a similar z-height budget as the die. This is different from traditional "molding" solutions (for warpage control purposes) which add on to the total z-height of the package. The integration of a pirmary core still further provides warpage control solutions to a package-on-package (POP) BBUL package (non-TSV die, see FIG. 1) with improved warpage control due to the flexibility of primary core material coverage on the die back side. For TSV dies, warpage control solutions are presented that enable both POP and wide I/O stacking (device directly to die).

Integrating a primary core into a package as described also eliminates the need for an extra molding operation (if needed) at the end of the process. If a molding operation is desired, the presence of a primary core surrounding a die provides an undulation process margin in, for example, a dielectric lamination operation because of "planarization" due to primary core material integration. Sill further, the use of a high stiffness primary core material reduces the risk of joint cracking between the microelectronic package and a second device connected thereto, such as a memory device or package.

Figure 3:
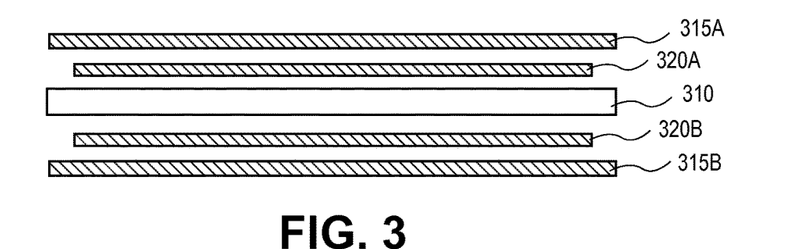
FIG. 3 shows a cross-sectional exploded side view of a sacrificial substrate with sacrificial copper foils attached to opposite sides thereof.

FIGS. 3-11 describe one embodiment for forming a microelectronic package, such as microelectronic package 100 (FIG. 1) having exposed contacts for a secondary package or a device to be connected thereto and with a non-TSV die. Referring to FIG. 3, FIG. 3 shows an exploded cross-sectional side view of a portion of sacrificial substrate 310 of, for example, a prepeg material including opposing layers of copper foils 315A and 315B that are separated from sacrificial substrate 310 by shorter copper foil layers 320A and 320B, respectively. Copper foils 315A and 315B tend to stick to the shorter foils based on vacuum.

Figure 4:
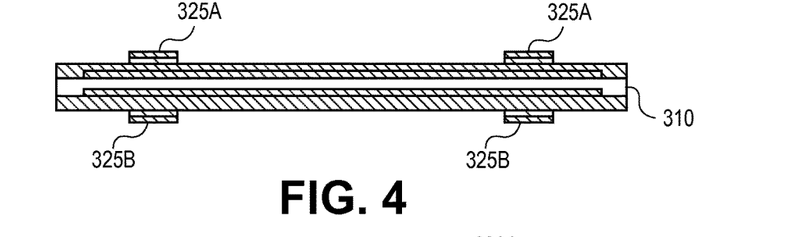
FIG. 4 show the structure of FIG. 3 following the formation of contacts on each of the copper foils.

FIG. 4 shows the structure of FIG. 3 following the formation of package contacts 325A and 325B on opposite sides of the structure. Contacts 325A and 325B will serve as external package contacts for connecting a microelectronic package to another package or a device. It is appreciated that contacts 325A and 325B may be representative of multiple similar contacts extending, for example, in rows in and/or out of the page. In one embodiment, contacts 325A and 325B include a first layer adjacent copper foil 315A and copper foil 315B, respectively, of a gold-nickel alloy and a second layer overlying a second layer of copper or a copper alloy overlying the gold-nickel alloy. Contacts 325A and 325B may be formed by deposition (e.g., plating, a sputter deposition, etc.) and patterning at a desired location for possible electrical contact with another device (e.g., a memory package).

Figure 5:
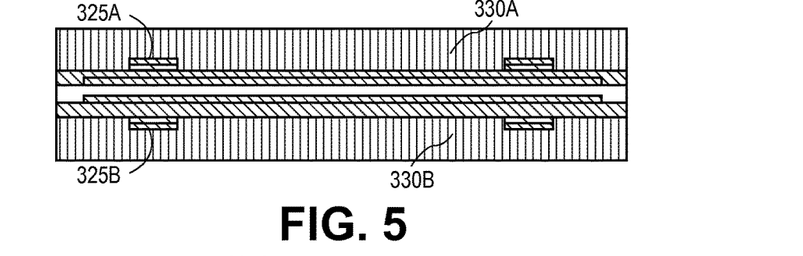
FIG. 5 shows the structure of FIG. 4 following the formation of a primary core material on each of the copper foils.

FIG. 5 shows the structure of FIG. 4 following the introduction of a primary core material on opposite sides of the structure. FIG. 5 shows primary core 330A and primary core 330B deposited over opposing surfaces including, in this embodiment, over contacts 325A and 325B, respectively. Primary core 330A and primary core 330B are, for example, a mold, high filler ABF or other material selected to have a coefficient of thermal expansion similar to that of a die that will be attached thereto. Primary core 330A and primary core 330B may be introduced by laminating a sheet of film of primary core material onto the structure or by a deposition method, such as spin-on or other deposition method. In one embodiment, a thickness of primary core 330A and primary core 330B is selected to be greater than a thickness of a die to be included in the microelectronic package.

Figure 6:
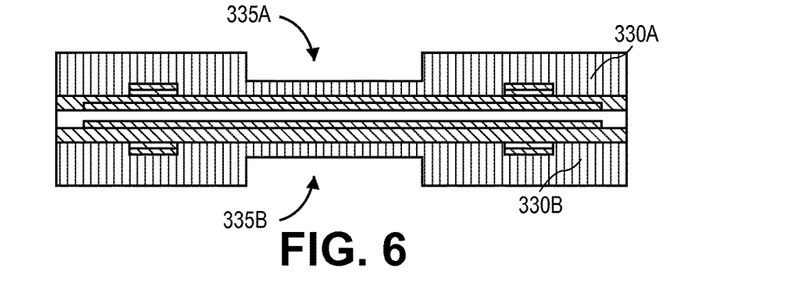
FIG. 6 shows the structure of FIG. 5 following the patterning of a cavity in the primary core material to receive a die.

FIG. 6 shows the structure of FIG. 5 following the patterning of primary core 330A and primary core 330B. In one embodiment, primary core 330A and primary core 330B are patterned to define cavity 335A and cavity 335B to accommodate a die therein. Accordingly, primary core 330A and primary core 330B are patterned to have a length and a width dimension such that a die of a desired size may fit within cavity 335A or cavity 335B. In another embodiment, cavity 335A and cavity 335B are patterned to have a length and a width dimension for more than one die arranged, for example, side by side. It is appreciated that a depth of cavity 335A and cavity 335B may or may not correspond to a thickness of a desired die. As shown in FIG. 6, in one embodiment, the formation of cavities in primary core 330A and primary core 330B, in one embodiment, does not proceed through the respective primary core materials to, for example, copper foil 315A and copper foil 315B. Instead, a depth of each cavity is such that there is remaining primary core material on copper foil 315A and copper foil 315B. A cavity in primary core material of a mold material or high filler ABF may be formed using, for example, a combination of dry film resist (DFR) resist lithography patterning/etching process.

Figure 7:
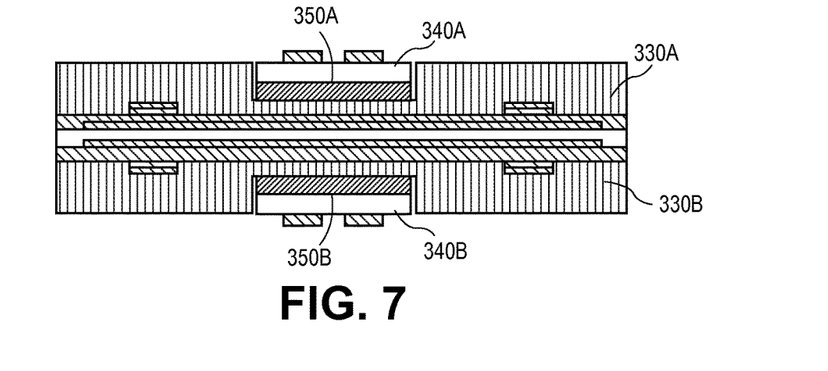
FIG. 7 shows the structure of FIG. 6 following the attaching of a die within each cavity of the primary core material.

FIG. 7 shows the structure of FIG. 5 following the mounting of die 340A and die 340B within cavity 335A and cavity 335B, respectively, of the primary cores. In one embodiment, die 340A and die 340B are non-TSV dies. As shown in FIG. 7, die 340A is connected to primary core 330A by adhesive 350A and die 340B is connected to primary core 330B by adhesive 350B. As viewed, in one embodiment, die 340A and die 340B have a thickness dimension that, combined with an adhesive layer, corresponds approximately to a depth of cavity 335A and cavity 335B, respectively. In another embodiment, cavity 335A and cavity 335B may be shallower. In one embodiment, whether a thickness of primary core 330A and primary core 330B is less than, equal to or greater than a die plus adhesive is a function of die surface area, die to package area ratio. FIG. 7 also shows die 340A and die 340B positioned with a device side of each die facing outward from cavity 335A and cavity 335B, respectively.

Figure 8:
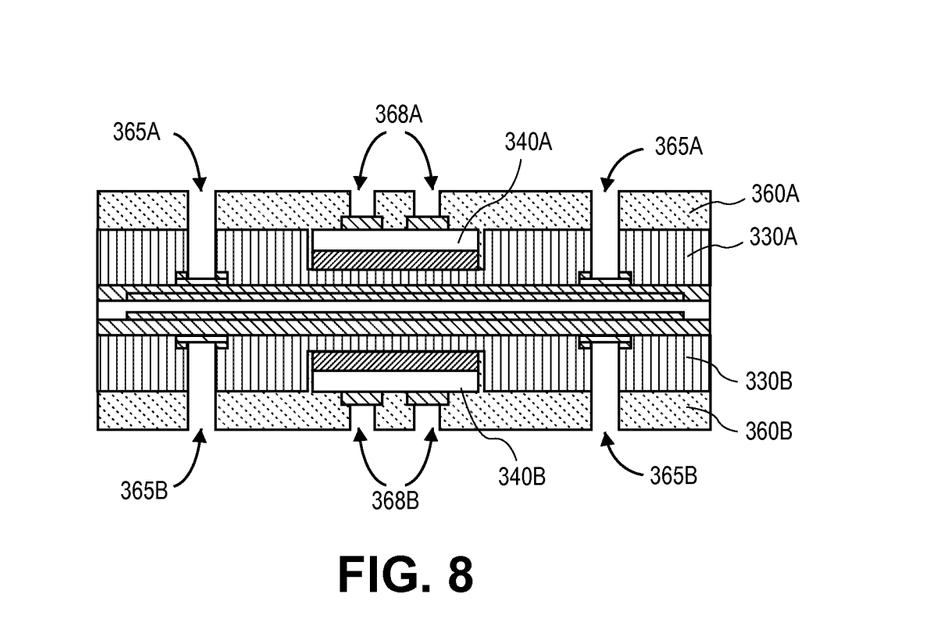
FIG. 8 shows the structure of FIG. 7 following the introduction of a dielectric or insulating material on the primary core material and the patterning of vias to contacts of the die and to the contacts on the copper foils.

FIG. 8 shows the structure of FIG. 7 following the introduction of dielectric material 360A and dielectric material 360B on opposite sides of the structure. In one embodiment, dielectric material 360A and dielectric material 360B are each an ABF dielectric possibly including a filler that have been described for use in forming a BBUL package. FIG. 8 also shows vias patterned through dielectric material 360A/360B and primary core 330A/330B to contact points 325A and 325B as well as through dielectric material 360A/360B to contact points on die 340A and die 340B.

Such patterning may be done by, for example, a drilling process. Conductor (e.g., metal) patterning may be done, for example, using an electroless seed layer followed by a dry film resist (DFR) patterning and plating. The DFR may then be stripped followed by a flash etch to remove any unwanted electroless seed layer. It is appreciated that other methods are also suitable. FIG. 8 shows via 365A and via 365B to contact points 325A and 325B, respectively, and vias 360A and 360B to contact points on die 340A and die 340B, respectively.

Figure 9:
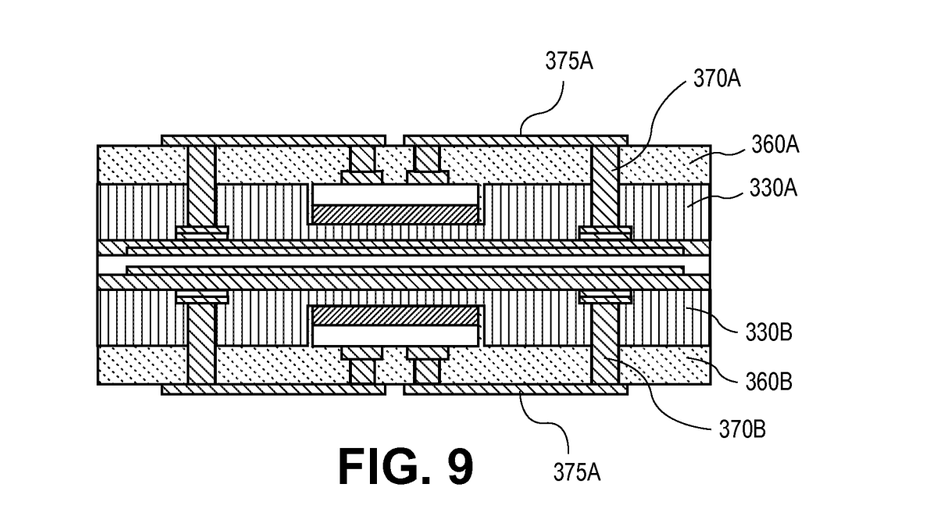
FIG. 9 shows the structure of FIG. 8 following the introduction of a conductive material in the vias and the patterning of a conductive line or trace on the dielectric or insulating material.

FIG. 9 shows the structure of FIG. 8 following the filling of vias with a conductive material and the patterning of a first conductive material level of a carrier. Conductive vias 365A, 365B are filled with a material such as copper and a first conductive material line of a similar material may be formed at the same time. Conductor (e.g., metal) patterning may be done, for example, using an electroless seed layer followed by a dry film resist (DFR) patterning and plating. The DFR may then be stripped followed by a flash etch to remove an electroless seed layer. It is appreciated that other methods are also suitable. For example, the vias may be filled and a copper foil then introduced on dielectric layers 360A and 360B, respectively. The copper foil is then patterned by, for example, etching into a desired trace pattern 375A, 375B on a surface of dielectric layer 360A and dielectric layer 360B, respectively.

Figure 10:
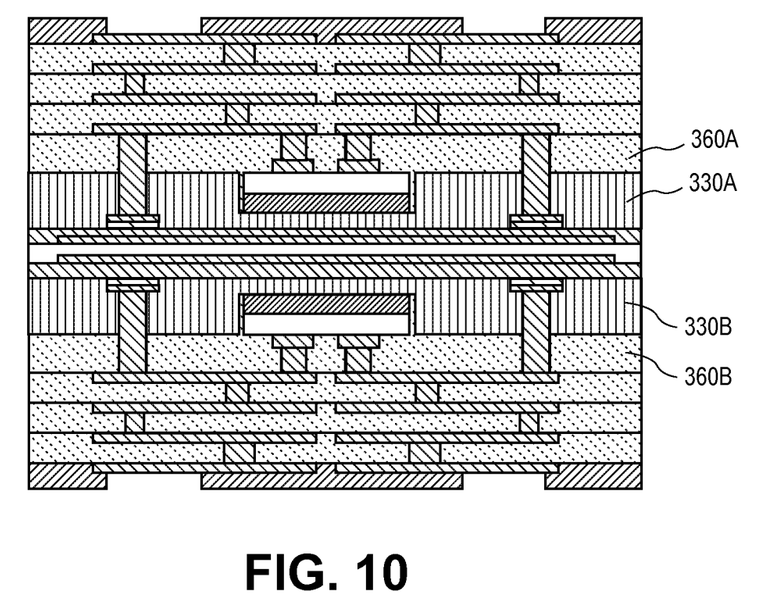
FIG. 10 shows the structure of FIG. 9 following the introduction of additional build-up layers on the dielectric or insulating material on each side of the sacrificial substrate.

FIG. 10 shows the structure of FIG. 9 following the patterning of additional levels of conductive traces of a carrier (e.g., three additional levels separated from one another by dielectric material). A typical BBUL package may have four to six levels of conductive traces. A top level is patterned with contacts that are suitable, for example, for a surface mount packaging implementation (e.g., a ball grid array).

Figure 11:
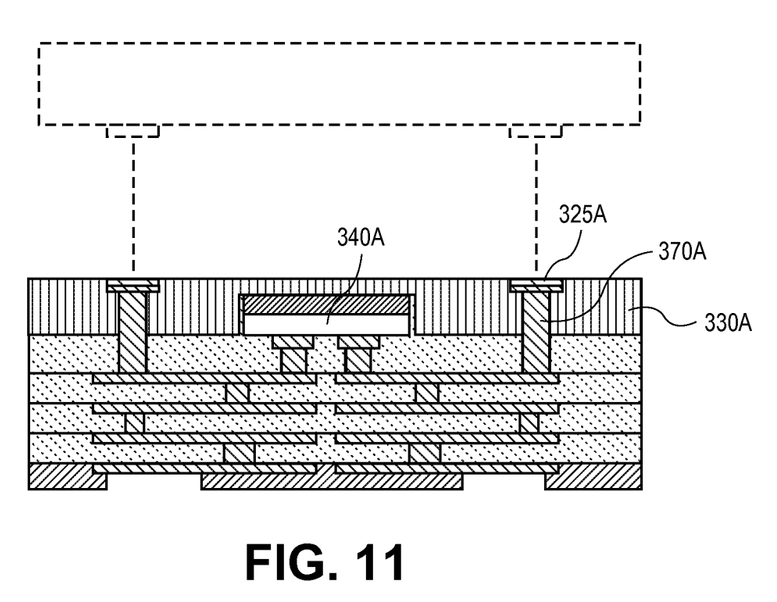
FIG. 11 shows a portion of the structure of FIG. 10 following the removal of the sacrificial substrate and foils.

FIG. 11 shows a portion of the structure of FIG. 10 following the separation of the structure into two individual packages by removal of sacrificial substrate 310 and copper foils 315A and 315B. By removing the individual packages from sacrificial substrate 310, FIG. 11 shows a free standing microelectronic package (such as package 100 in FIG. 1) that has a non-TSV embedded die in a primary core and a die connected at a device side to a build-up carrier including a number of alternating layers of conductive material (four levels of conductive traces) and dielectric or insulating material. Contact points of die 340A, for example, copper pillars, fabricated in a silicon fabrication process, that are connected to the conductive material of the build-up carrier. The package also includes exposed contacts 325A for electrical connection with another package, shown in ghost lines to provide a package on package (POP) configuration.

Figure 12:
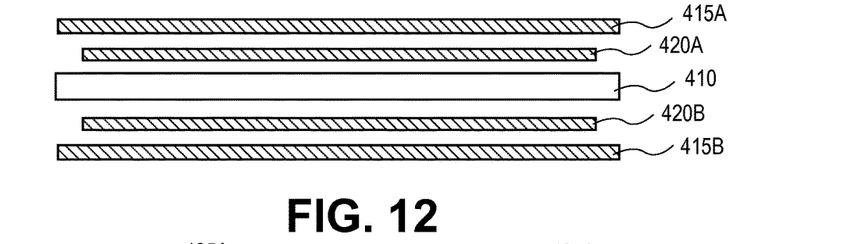
FIG. 12 shows a cross-sectional exploded side view of a sacrificial substrate with sacrificial copper foils attached to opposite sides thereof according to another embodiment of forming a microelectronic package.

FIGS. 12-22 show another embodiment of a process performing a microelectronic package, such as microelectronic package 200 (FIG. 2) having exposed contacts for a secondary package or a device to be connected thereto and a TSV die. Referring to FIG. 12, FIG. 12 shows an exploded cross-sectional side view of a portion of sacrificial substrate 410 of, for example, a prepeg material including opposing layers of copper foils 415A and 415B that are separated from substrate 410 by shorter copper foil layers 420A and 420B, respectively.

Figure 13:
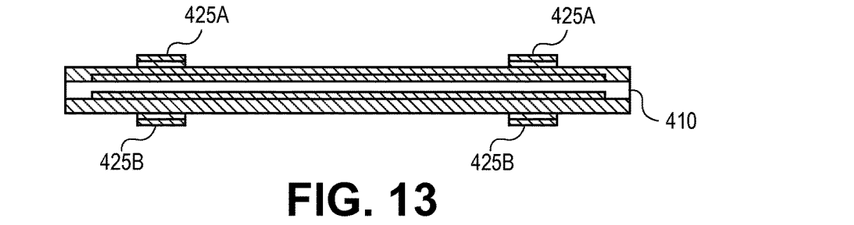
FIG. 13 shows the structure of FIG. 12 following the formation of contacts on each of the copper foils.

FIG. 13 shows the structure of FIG. 12 following the formation of package contacts 425A and 425B on opposite sides of the structure. Contacts 425A and 425B will serve as external package contacts for connecting a microelectronic package to another package or a device. In one embodiment, contacts 425A and 425B include two layers, a first layer adjacent copper foil 415A and copper foil 415B, respectively, of a gold-nickel alloy and a second layer of copper or a copper alloy.

Figure 14:
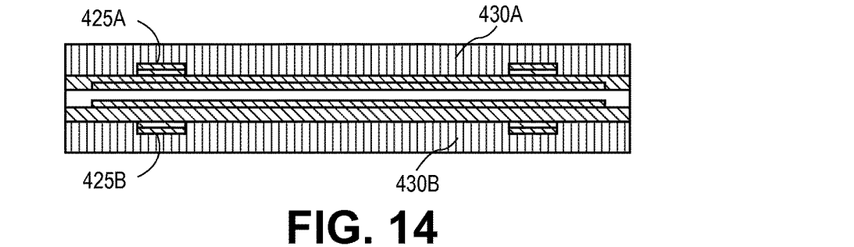
FIG. 14 shows the structure of FIG. 13 following the formation of a primary core material on each of the copper foils.

FIG. 14 shows the structure of FIG. 13 following the introduction of a primary core material on opposite sides of the structure. FIG. 14 shows primary core 430A and primary core 430B deposited over the respective surfaces including, in this embodiment, over contacts 425A and 425B. Primary core 430A and primary core 430B are, for example, a mold, a high filler ABF or other material selected to have a coefficient of thermal expansion similar to that of a die that will be attached thereto. As noted above, a primary core material may be introduced by lamination of a sheet of film or by deposition method. In one embodiment, a thickness of primary core 430A and primary core 430B is selected to be no greater than a thickness of a die to be included in the microelectronic package. In another embodiment, whether a thickness of primary core 430A and primary core 430B are less than, equal to or greater than a die and adhesive is a function of die surface area, die to package area ratio, an overall thickness of a package, a desired warpage of a package at a given temperature final architecture, warpage required at a unit level, strip level or panel level.

Figure 15:
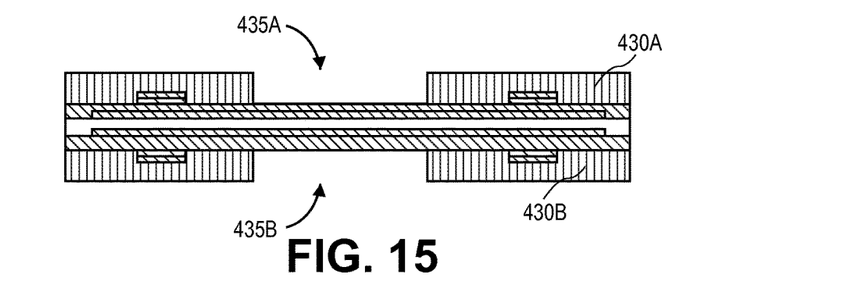
FIG. 15 shows the structure of FIG. 14 following the patterning of a cavity in the primary core material to receive a die.

FIG. 15 shows the structure of FIG. 14 following the patterning of primary core 430A and primary core 430B. In one embodiment, primary core 430A and primary core 430B are patterned to define cavity 435A and cavity 435B through the primary core material to copper foil 415A and copper foil 415B, respectively, and to have a length and width dimensions such that a die of a desired size may fit within cavity 435A and cavity 435B. In another embodiment, cavity 435A and cavity 435B are patterned to have dimensions to accommodate multiple die (e.g., two die side-by-side). As noted above, the cavity may be formed using, for example, a combination of DFR/resist lithography patterning/etching process.

Figure 16:
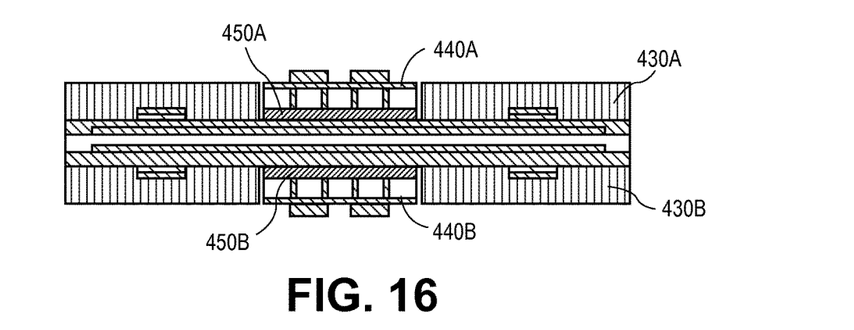
FIG. 16 shows the structure of FIG. 15 following the attaching of a die within each cavity of the primary core material.

FIG. 16 shows the structure of FIG. 15 following the mount of die 440A and die 440B within cavity 435A and cavity 435B, respectively, of the primary cores. In one embodiment, die 440A and die 440B are TSV dies. Each die is mounted with its device size opposite copper foil 415A and copper foil 415B, respectively. As viewed, a non-device side of each die is connected to copper foil 415A and copper foil 415B, respectively, through adhesive 450A and adhesive 450B. As viewed, die 440A and die 440B have a thickness dimension that, combined with adhesive layer, corresponds approximate to a depth of cavity 435A and cavity 435B in each primary core, respectively. In another embodiment, cavity 435A and cavity 435B may be shallower (e.g., a thickness of primary core 430A and primary core 430B may be less). In another embodiment, whether a thickness of primary core 430A and primary core 430B are less than, equal to or greater than a die and adhesive is a function of die surface area, die to package area ratio, an overall thickness of a package, a desired warpage of a package at a given temperature final architecture, warpage required at a unit level, strip level or panel level.

Figure 17:
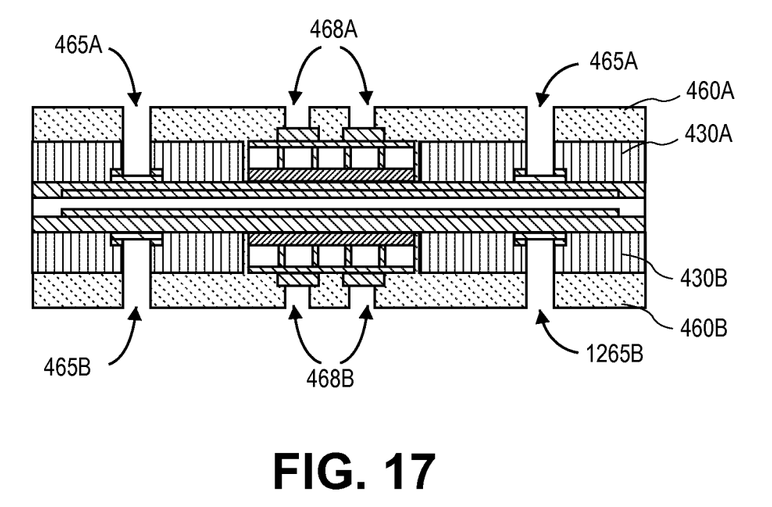
FIG. 17 shows the structure of FIG. 16 following the introduction of a dielectric or insulating material on the primary core material and the patterning of vias to contacts of the die and to the contacts on the copper foils.

FIG. 17 shows the structure of FIG. 16 following the introduction and patterning of the dielectric material on opposite sides of the structure. In one embodiment, dielectric material 460A and dielectric material 460B are each an ABF dielectric possibly including a filler. FIG. 17 also shows patterning of vias 465A and 465B to contact points 325A and 325B, respectively, as well as vias 468A and 468B to contact points on die 440A and die 440B, respectively. Such patterning may be done by, for example, drilling, laser ablation or etching.

Figure 18:
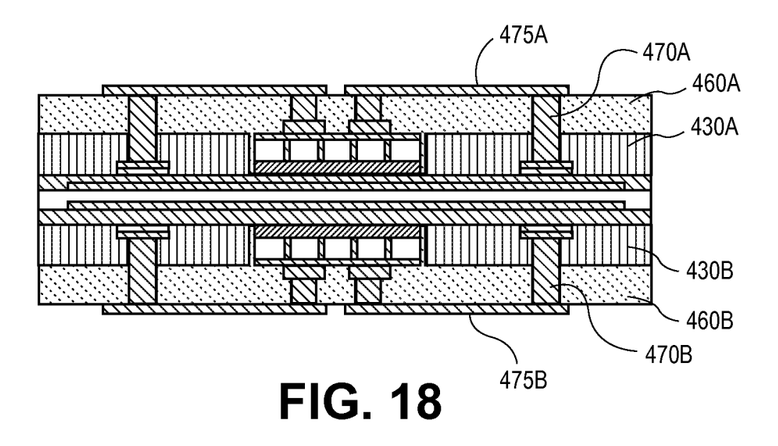
FIG. 18 shows the structure of FIG. 17 following the introduction of a conductive material in the vias and the patterning of a conductive line or trace on the dielectric or insulating material.

FIG. 18 shows the structure of FIG. 17 following the filling of vias and patterning of a first conductive material of a carrier. In one embodiment, vias 465A, 465B, 468A and 468B are filled with a conductive material 470A, 470B such as copper and the copper is patterned into a desired line or trace pattern 475A, 475B on a surface of dielectric layer 460A and dielectric layer 460B, respectively. One way conductor (e.g., metal) patterning may be done is, for example, using an electroless seed layer followed by a dry film resist (DFR) patterning and plating. The DFR may then be stripped followed by a flash etch to remove an electroless seed layer. It is appreciated that other methods are also suitable.

Figure 19:
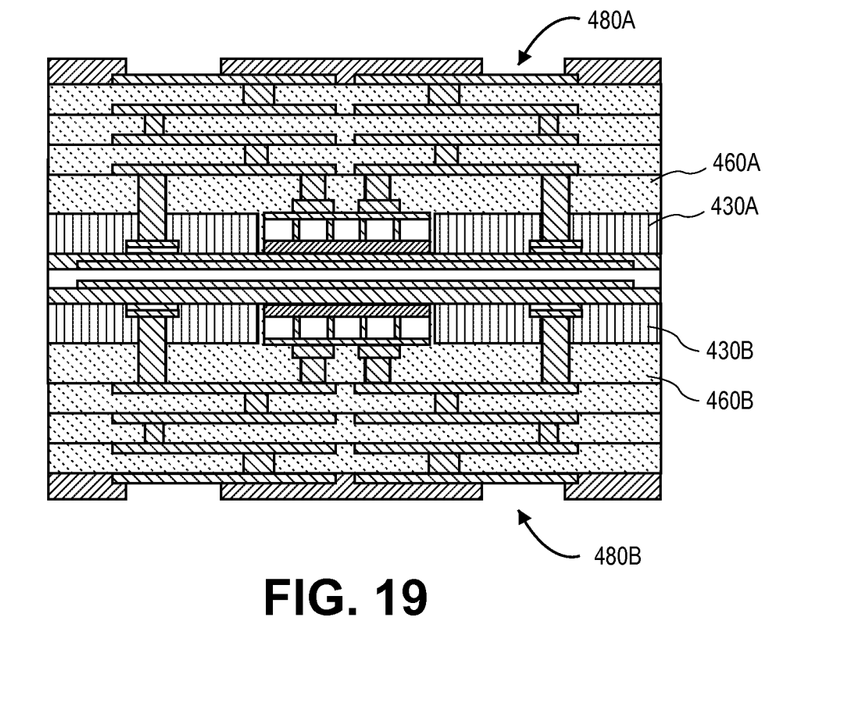
FIG. 19 shows the structure of FIG. 18 following the introduction of additional build-up layers on the dielectric or insulating material on each side of the sacrificial substrate.

FIG. 19 shows the structure of FIG. 18 following the patterning of additional levels of conductive traces of a carrier (e.g., three additional levels separated from one another by dielectric material). A typical BBUL package may have four to six levels of conductive traces. A top level is patterned with contacts 480A, 480B that are suitable, for example, for a surface mount packaging implementation (e.g., a ball grid array).

Figure 20:
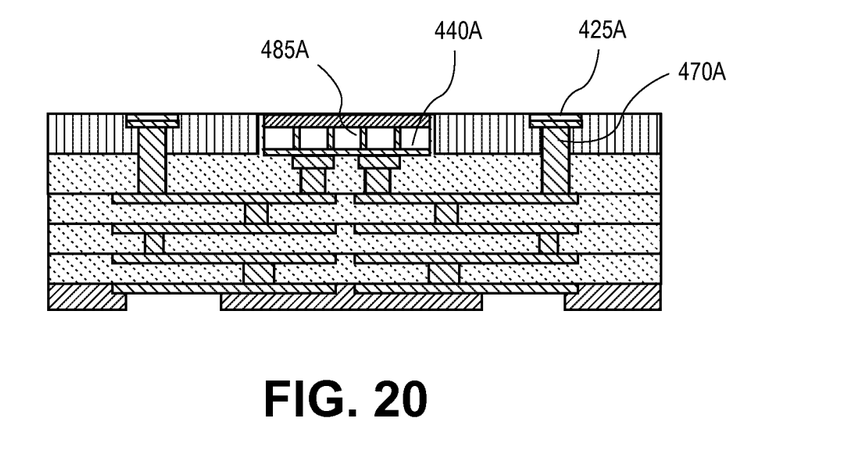
FIG. 20 shows a portion of the structure of FIG. 19 following the removal of the sacrificial substrate and foils.

FIG. 20 shows a portion of the structure of FIG. 19 following the separation of the structure into two individual packages by removal of sacrificial substrate 410 and copper foils 415A and 415B. By removing the individual packages from sacrificial substrate 410, FIG. 20 shows a free standing microelectronic package (such as package 200 in FIG. 2) that has a TSV die in a primary core connected at a device side to a build-up carrier including a number of alternating layers of conductive material (four levels of conductive traces) and dielectric or insulating material. Contact points of die 440A are, for example, pillars fabricated at the die fabrication process and are connected to the conductive material of the build-up carrier. The package also includes exposed contacts 425A for electrical connection with another device or package. Further, die 440A as a TSV die includes conductive vias 485A extending from a device die to a backside of the die.

Figure 21:
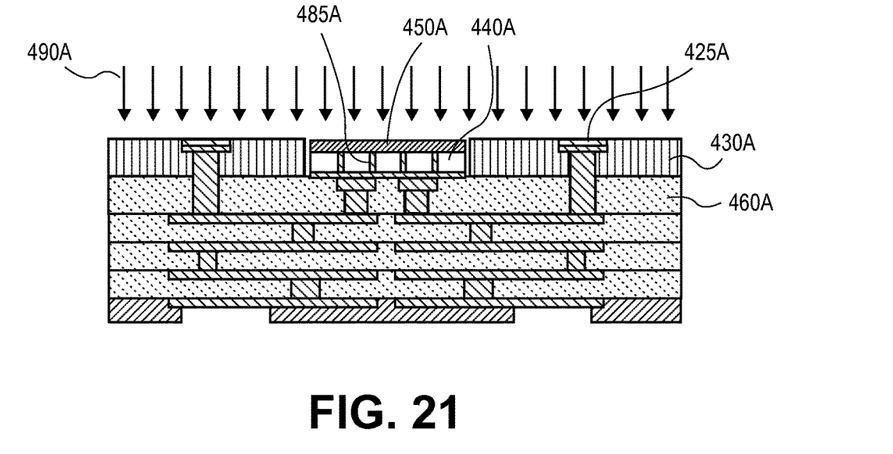
FIG. 21 shows the structure of FIG. 20 exposed to a etch.

In one embodiment, to make conductive vias 485A available for contact to another device, for example, for wide I/O stacking, adhesive layer 450A is removed. FIG. 21 shows a removal process where adhesive 450A such as DBF is removed using a dry (plasma) or wet etch 490A. FIG. 21 illustrates that primary core 430A may be used as a mask for underlying carrier layer such as dielectric or insulating layer 460A during an etch process to remove adhesive 450A. Accordingly, primary core 430A reduces or eliminates that might otherwise be present if a die were to be exposed in the absence of a primary core material and an adhesive might need to be cleared where a die was otherwise surrounded by dielectric mold material. It is appreciated that all the adhesive need not be removed. In another embodiment, only a portion of the adhesive layer is removed to expose certain but not all TSV contacts on die 440A. Additional patterning may be necessary to, for example, protect those contacts that do not need to be exposed.

Figure 22:
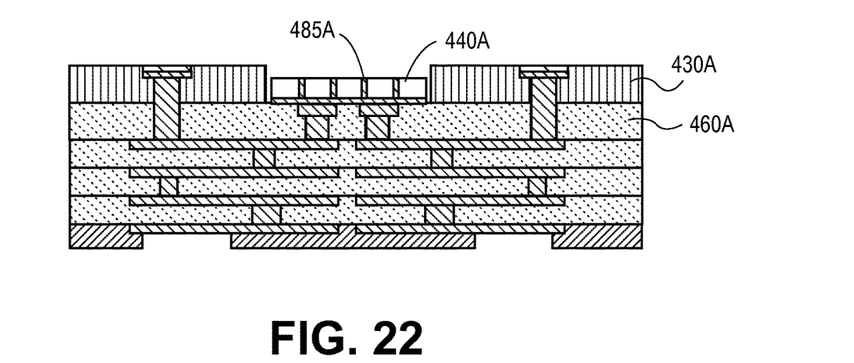
FIG. 22 shows the structure of FIG. 21 following the removal of an adhesive layer over the die.
Figure 23:
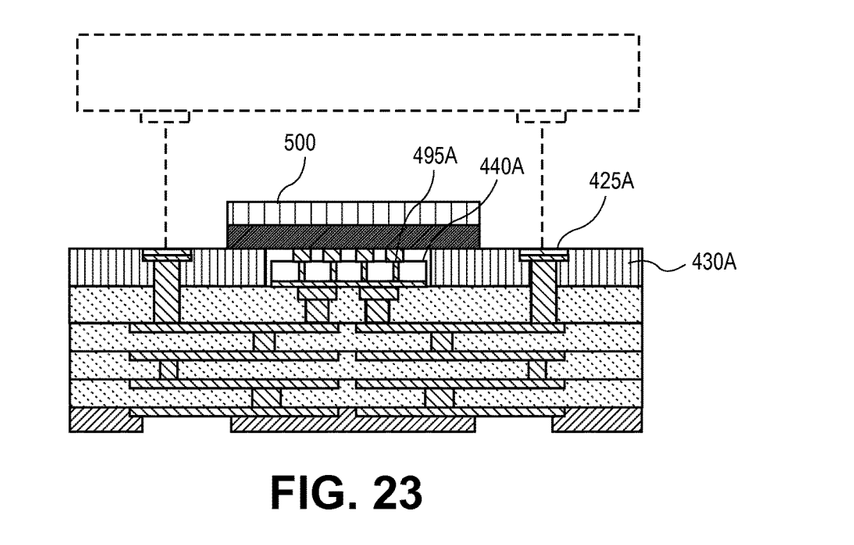
FIG. 23 shows the structure of FIG. 22 having a second device connected to the die and possibly a third device also connected thereto.

FIG. 22 shows the structure of FIG. 21 after the removal of adhesive layer 450A on die 440A. Once the adhesive layer is removed, in this embodiment, LMI/LLI pads are exposed. FIG. 23 shows the structure of FIG. 22 following the connection of a secondary die to die 440A in the now formed microelectronic package. FIG. 23 shows secondary die 500 that is, for example, a memory or a logic die electrically connected to die 440A through contacts 495A between the die (through logic-memory interface or logic-logic interface pads). FIG. 23 also shows that an additional device, such as a package, can be connected to the formed microelectronic package through contacts 495A. Representatively, a memory package may be aligned over the formed package as connected to contact 425A.

Figure 24:
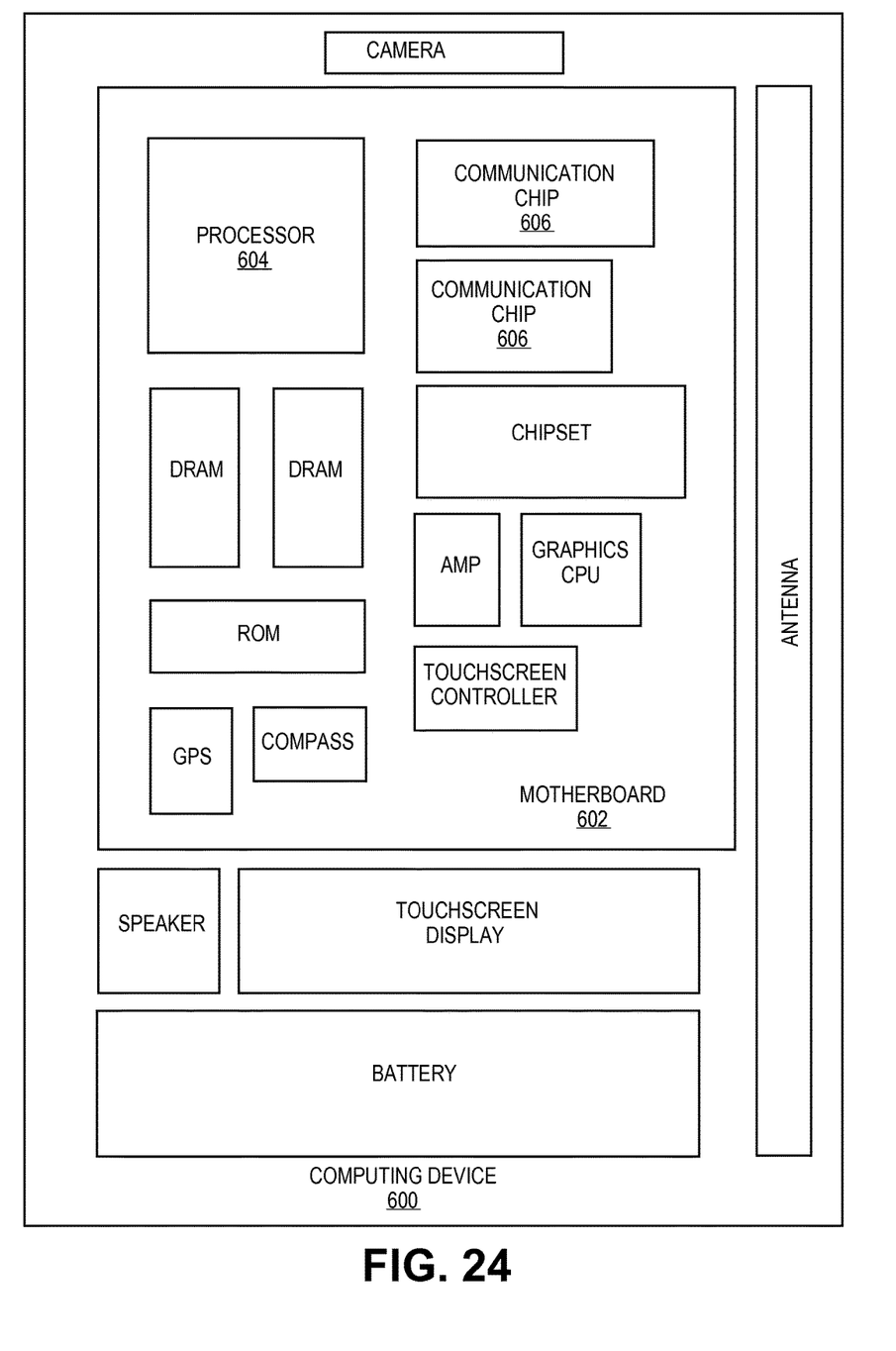
FIG. 24 illustrates a schematic illustration of a computing device.

FIG. 24 illustrates a computing device 600 in accordance with one implementation. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations, the package formed in accordance with embodiment described above utilizes BBUL technology with a primary core surrounding a TSV or non-TSV die that inhibits package warpage. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation, package is based on BBUL technology and incorporates a primary core surrounding a TSV or non-TSV integrated circuit die that inhibit package warpage. Such packaging will enable stacking of various devices, including but not limited to, a microprocessor chip (die) with a memory die with a graphics die with a chip set with GPS.

In further implementations, another component housed within the computing device 600 may contain a microelectronic package incorporates a primary core surrounding a TSV or non-TSV integrated circuit die that inhibits package warpage.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

The invention claimed is:

1. An apparatus comprising:
a die comprising a first side and an opposite second side comprising a device side with contact points and lateral sidewalls defining a thickness of the die;
a primary core having a cavity therein, wherein the die is positioned in the cavity such that the primary core is adjacent at least a pair of the lateral sidewalls of the die, the primary core comprising a material having a coefficient of thermal expansion similar to a coefficient of thermal expansion of the die;
a build-up carrier coupled to the second side of the die, the build-up carrier comprising a plurality of alternating layers of conductive material and insulating material wherein at least one of the layers of conductive material is coupled to one of the contact points of the die at a point outside the cavity of the primary core and a first plurality of contacts on a surface of the build-up carrier and coupled to at least one of the plurality of alternating layers of conductive material; and
a second plurality of contacts comprising multilayer contacts disposed within and on a surface of the primary core and coupled to at least one of the plurality of alternating layers of a conductive material.

2. The apparatus of claim 1, wherein the material of the primary core achieves a predetermined warpage target for at least one of a given temperature, package architecture, number of package layers, body size and a die to package area ratio.

3. The apparatus of claim 1, wherein the material of the primary core is different than the insulating material of the build-up carrier.

4. The apparatus of claim 1, wherein a thickness of the primary core is similar to a thickness of the die.

5. The apparatus of claim 1, wherein the die comprises four lateral side walls and the primary core is adjacent each of the four lateral side walls.

6. The apparatus of claim 1, wherein the first side of the die defines a plane and a thickness of the primary core defines a surface that is no greater than the plane of the first surface of the die.

7. The apparatus of claim 1, wherein the primary core is disposed on the first surface of the die.

8. An apparatus comprising:
a computing device comprising a package comprising:
a microprocessor comprising a first side and an opposite second side comprising a device side with contact points and lateral sidewalls defining a thickness of the microprocessor;
a primary core having a cavity therein, wherein the microprocessor is positioned in the cavity such that the primary core is adjacent at least a pair of the lateral sidewalls of the microprocessor, the primary core comprising a material having a coefficient of thermal expansion similar to a coefficient of thermal expansion of the die; and
a build-up carrier coupled to the second side of the microprocessor, the build-up carrier comprising:
a plurality of alternating layers of conductive material and insulating material, wherein at least one of the layers of conductive material is coupled to one of the contact points of the microprocessor at a point outside the cavity of the primary core; and
a first plurality of accessible contacts opposite a microprocessor side of the build-up carrier and a second plurality of contacts on the microprocessor side of the build-up carrier, wherein the second plurality of contacts comprise multilayer contacts disposed within and on a surface of the primary core; and
a printed circuit board coupled to at least a portion of the first plurality of accessible contacts of the package.

9. The apparatus of claim 8, further comprising:
a secondary device coupled to the second plurality of contacts.

10. The apparatus of claim 9, wherein the secondary device comprises at least one memory device.

11. The apparatus of claim 8, wherein the material of the primary core has a property and dimensions selected to target a predetermined warpage target of the combination of the microprocessor and the build-up carrier.

* * * * *